US010825781B2

(12) United States Patent
Kang et al.

(10) Patent No.: US 10,825,781 B2
(45) Date of Patent: Nov. 3, 2020

(54) SEMICONDUCTOR DEVICE WITH CONDUCTIVE FILM SHIELDING

(71) Applicant: NXP B.V., Eindhoven (NL)

(72) Inventors: Chia Hao Kang, Kaohsiung (TW); Chung Hsiung Ho, Kaohsiung (TW)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/051,498

(22) Filed: Aug. 1, 2018

(65) Prior Publication Data
US 2020/0043862 A1 Feb. 6, 2020

(51) Int. Cl.
| H01L 23/552 | (2006.01) |
| H01L 23/00 | (2006.01) |
| H01L 23/367 | (2006.01) |
| H01L 25/00 | (2006.01) |
| H01L 23/373 | (2006.01) |

(52) U.S. Cl.
CPC .......... *H01L 23/552* (2013.01); *H01L 23/367* (2013.01); *H01L 23/3736* (2013.01); *H01L 24/09* (2013.01); *H01L 24/17* (2013.01); *H01L 25/50* (2013.01); *H01L 2224/02331* (2013.01); *H01L 2224/02371* (2013.01)

(58) Field of Classification Search
CPC ................... H01L 23/552; H01L 23/42; H01L 21/563–568
See application file for complete search history.

(56) References Cited

U.S. PATENT DOCUMENTS

| 5,166,772 A | 11/1992 | Soldner et al. |
| 6,143,406 A | 11/2000 | Uchida et al. |
| 6,195,267 B1 | 2/2001 | MacDonald, Jr. et al. |
| 7,701,040 B2 * | 4/2010 | Huang ................. H01L 21/561 257/659 |
| 8,338,938 B2 | 12/2012 | Hsu et al. |
| 9,520,645 B2 | 12/2016 | Walters et al. |
| 10,134,685 B1 * | 11/2018 | Chen .................... H01L 21/4857 |
| 2002/0052105 A1 | 5/2002 | Akram |
| 2009/0001599 A1 | 1/2009 | Foong et al. |
| 2009/0075068 A1 | 3/2009 | Pyo et al. |
| 2011/0186324 A1 | 8/2011 | Hur et al. |
| 2011/0278703 A1 * | 11/2011 | Pagaila ............... H01L 23/5389 257/659 |
| 2013/0320513 A1 * | 12/2013 | Lin ....................... H01L 23/552 257/659 |
| 2015/0014838 A1 * | 1/2015 | Yap ....................... H01L 23/367 257/706 |
| 2016/0351549 A1 * | 12/2016 | Lin ........................ H01L 21/50 |
| 2017/0367175 A1 * | 12/2017 | Lai ........................ H05K 1/0203 |
| 2018/0040530 A1 * | 2/2018 | Mahler ............. H01L 23/49513 |
| 2019/0237407 A1 * | 8/2019 | Lee ........................ H01L 21/565 |

OTHER PUBLICATIONS

Annette Teng, "Die Attach Film Applications," MEPTEC Report Winter 2016.

* cited by examiner

*Primary Examiner* — Stephen M Bradley
(74) *Attorney, Agent, or Firm* — Sherry W. Schumm

(57) ABSTRACT

A packaged semiconductor device has a conductive film that covers a first major surface and surrounding side surfaces of an integrated circuit die. The conductive film provides five-sided shielding of the integrated circuit die. A metal heat sink may be attached to an exposed major surface of the conductive film for dissipating heat generated by the die.

17 Claims, 2 Drawing Sheets

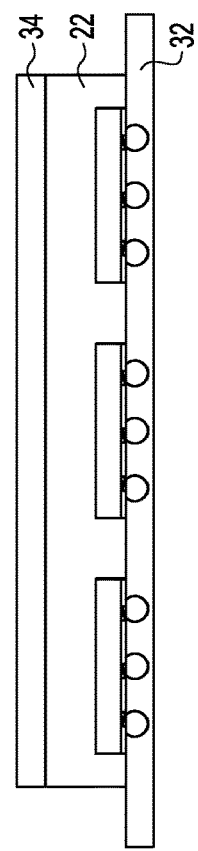
FIG. 4A
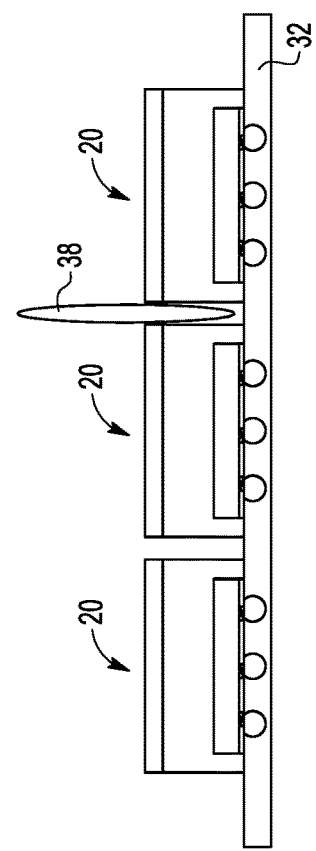
FIG. 4B
FIG. 4C
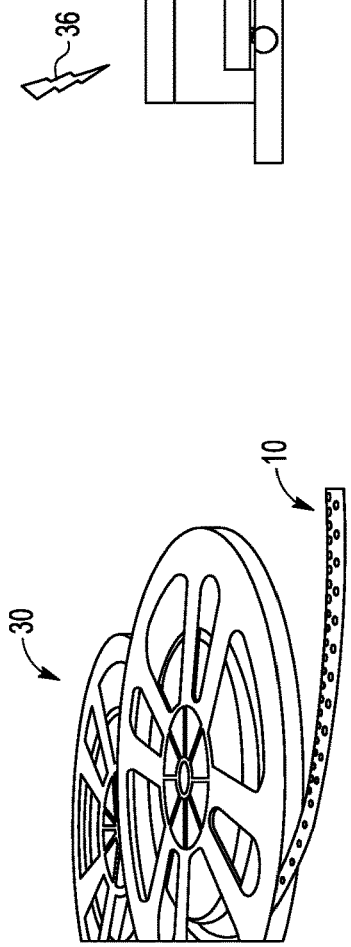
FIG. 4D
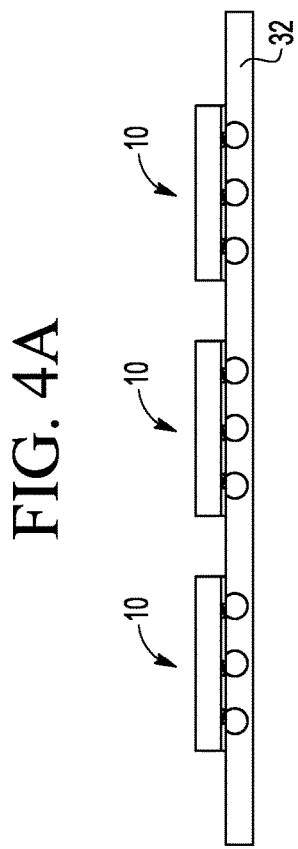
FIG. 4E
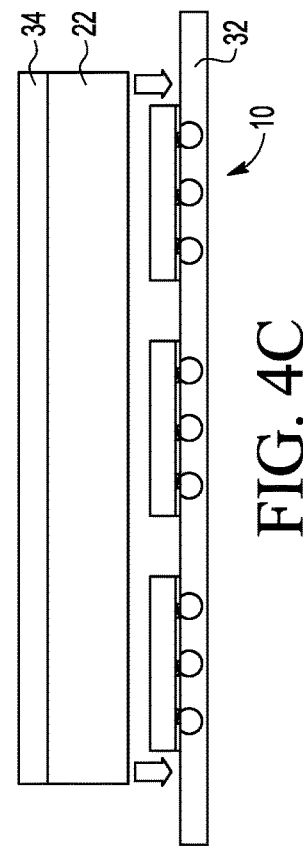
FIG. 4F
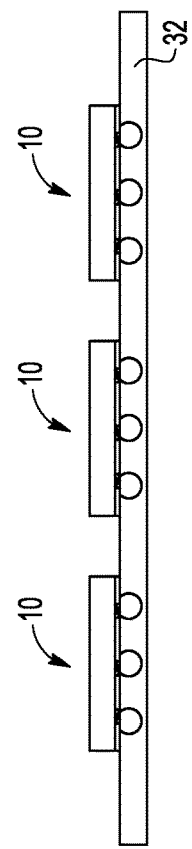

SEMICONDUCTOR DEVICE WITH CONDUCTIVE FILM SHIELDING

BACKGROUND OF THE INVENTION

The present invention relates to integrated circuit (IC) packaging and, more particularly, to a packaged IC with conductive film shielding.

Wafer Level Packaging has become very popular due to the small size of the overall package and lower cost due to not requiring a lead frame or wire bonding. A common method of assembly includes placing semiconductor dies face down on a temporary carrier or substrate. The dies and temporary carrier may be over-molded with a molding compound using a compression molding process. After molding, the carrier or substrate is removed. The molded dies then are turned over, leaving the die active surfaces exposed. A build-up structure is formed over the dies and conductive balls are attached to the build-up structure. The assembly is then singulated, thereby providing individual devices. Other devices skip the molding step and comprise a die have conductive balls attached to the active surface. FIG. 1 shows a wafer level packaged device 10 comprising an integrated circuit die 12. A redistribution layer (RDL) 14 is formed over the active surface of the die 12 and conductive balls 16 are attached to the RDL 14, with the RDL 14 electrically connecting the die 12 and the conductive balls 16.

While the above-method provides for small devices, as the packaging requirements are minimal, there is no protection for the die from the external environment, such as dust, humidity and other environmental factors that could damage the delicate circuitry. Another issue for this type of packages is that it does not provide shielding from radiation, such as radio frequency interference (RFI) or electromagnetic interference (EMI). Such shielding can be critical for high-frequency circuits, such as two-way radios.

Conventional shielding systems generally comprise a conductive metallic enclosure that surrounds the IC. The enclosure acts either to protect the integrated circuit, from external RFI or EMI signals or to prevent the escape of RFI or EMI signals generated by the IC. Conventional shielding enclosures have been made by attaching a metal casing over a transfer molded package and soldering the metal casing to a substrate attached to the device. Unfortunately, this method of shielding is very costly and cumbersome when used to shield integrated circuits, as the casing increases the thickness or bulk of the package considerably. In addition, the heat required to solder the casing to the molded package can damage the die. Yet another issue is that such shielding enclosures are not necessarily very good at dissipating heat generated by the integrated circuit.

Thus, it would be desirable to have a semiconductor package with shielding and heat dissipation, and is easy and inexpensive to assemble.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention. For example, the size and dimensions of some elements have been exaggerated for ease of understanding and explanation.

FIGS. 4(A) to 4(F) illustrate a method of assembling the packaged device illustrated in FIGS. 2 and 3.

DETAILED DESCRIPTION OF THE INVENTION

Figure 2:
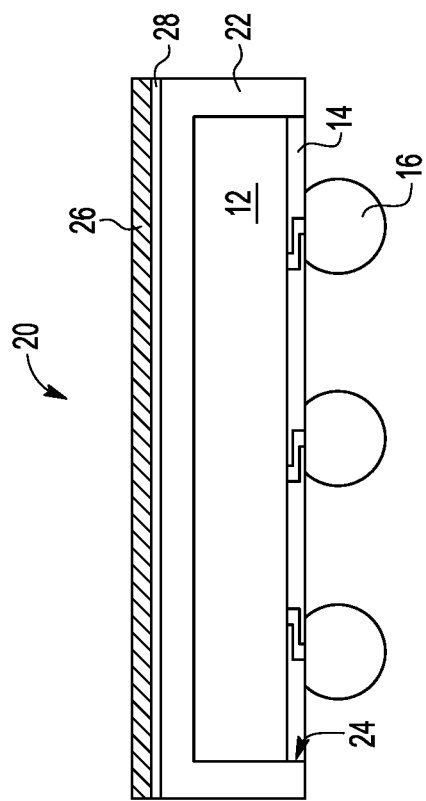
FIG. 2 is an enlarged cross-sectional side view of a packaged semiconductor device in accordance with an embodiment of the present invention.

The detailed description set forth below in connection with the appended drawings is intended as a description of a presently preferred embodiment of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

In one embodiment, the present invention provides a method of assembling a plurality of semiconductor devices, comprising: attaching a plurality of semiconductor dies to a carrier, wherein active sides of the dies are attached to the carrier, and passive sides of the dies are face-up; and covering the passive sides of the dies with a conductive film, where the conductive film also covers lateral sides of the dies.

In another embodiment, the present invention provides a packaged semiconductor device, comprising: a semiconductor integrated circuit die having a top, active surface, a bottom, passive surface, and four lateral side surfaces. A conductive film is formed over a major surface and the four lateral side surfaces of the die. The conductive film, which preferably is filled with metal, provides shielding of the integrated circuit die. A metal heat sink may be attached to an exposed, major surface of the conductive film to dissipate heat generated by the die.

Referring now to FIG. 2, an enlarged, cross-sectional side view of a packaged semiconductor device 20 in accordance with an embodiment of the present invention is shown. The device 20 includes an integrated circuit die 12. The die 12 is rectangular and has a bottom, active surface, an opposing top, passive surface, and four lateral side surfaces that extend between the to and bottom surfaces.

A redistribution layer (RDL) 14 is formed over the active surface of the die 12 and conductive balls 16 are attached to the RDL 14. The RDL 14 electrically connects the die 12 and the conductive balls 16. The RDL 14 may be formed over just the active side of the die 12, as shown in FIG. 2. In one embodiment, the RDL 14 comprises at least a first polyimide layer, a metal layer, a second polyimide layer, and an under-bump metallization (UBM) layer, and is formed using known techniques such that bonding pads on the active side of the die 12 are electrically coupled to exposed metal ends of the RDL 14. In other embodiments, the RDL 14 comprises a plurality of dielectric layers and conductive layers deposited on the active side of the die 12 to form electrical connections between bond pads on the die 12 and redistributed solder bump bond pads of the RDL 14. The conductive balls 16 are attached to the exposed metal ends of the RDL 14, thereby providing IO access to/from the die 12 and its underlying circuitry.

As known by those of skill in the art, the die 12 may generate heat when in operation or under test. The die 12 also may either generate electromagnetic radiation or be sensitive to electromagnetic interference (EMI). Accordingly, a film 22 is formed over the top surface and the four lateral side surfaces of the die 12. In a presently preferred embodiment, the film 22 is electrically conductive and functions as a shield, shielding the die from EMT. The film 22 also may prevent electromagnetic radiation generated by the die 12 from escaping the package, thereby protecting surrounding electronic circuitry from EMI caused by the packaged device 20.

In a presently preferred embodiment, the film 22 includes an inner metal filler, such as a silver filled DAF (Die Attach Film). In one embodiment, the film 22 is electrically connected to an exposed terminal of the RDL 16, which is shown at electrical connection 24. The film 22 may be attached to the outer surface of the die 12 with an adhesive, or in one embodiment, a silver-filled DAF is laminated to the die 12, where laminating includes a combination of pressure, an adhesive, and heat.

In another embodiment, if EMI shielding is not required, the film 22 may comprise a synthetic material such as rubber, in which case the film 22 functions to protect the die 12 from external forces such as banging, jarring or vibration.

If the die 12 generates excessive heat, either in operation or when undergoing testing, such that it would be advantageous to have a heat sink to dissipate the generated heat in order to avoid damage to the die 12, then an optional heat sink 26 may be attached to the top, exposed surface of the film 22, as shown in FIG. 2. The heat sink 26 may comprise a metal slug, a coated metal, or metal powder attached to the film 22. In one embodiment, the heat sink 26 is a sheet of metal attached to the film 22 with a thermal adhesive 28. The adhesive 28 may comprise, for example, glue or a backside protection adhesive applied with a tape.

Figure 3:
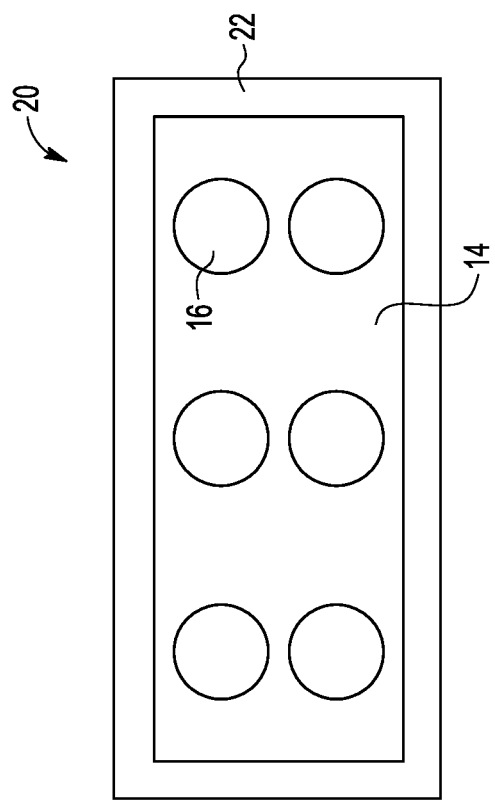
FIG. 3 is a bottom plan view of the packaged device shown in FIG. 2.
Figure 1:
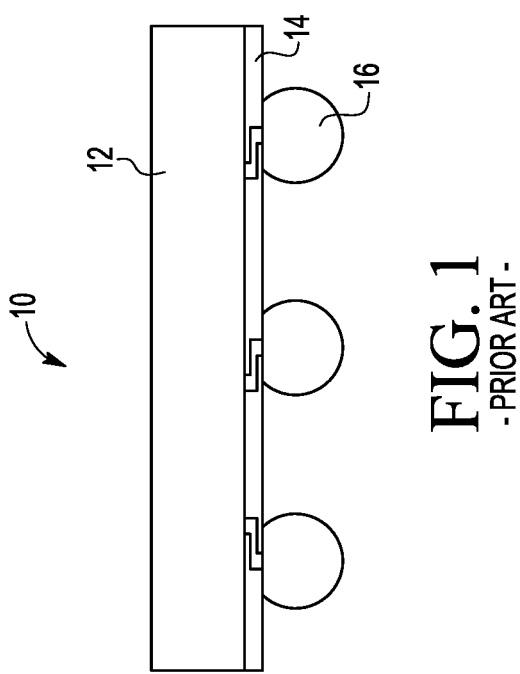
FIG. 1 is an enlarged cross-sectional side view of a conventional wafer level chip scale package (WLCSP) device.

FIG. 3 is a bottom plan view of the device 20 shown in FIG. 2, and shows RDI 14 being surrounded by the film 22, i.e., the conductive film 22 covers the four lateral sidewalls of the device 20.

FIGS. 4(A) to 4(F) are a series of enlarged cross-sectional side views illustrating various steps of a method of assembling packaged semiconductor devices 20 in accordance with an embodiment of the present invention. First, as shown in FIG. 4(A), a plurality of devices, such as wafer level chip scale package devices 10 are provided. The devices 10 may be provided on a tape wound around a reel, as is known in the art.

The devices 10 are placed on a carrier 32, which in one embodiment is a sawing tape mounted on a film frame carrier, as shown in FIG. 4(B). The devices 10 are mounted with their active sides facing the carrier 32. That is, the conductive balls 18 of the devices 10 contact the carrier 32. The active sides of the devices 10 may be attached to the carrier 32 with an adhesive, and the opposing passive sides of the devices 10 are exposed.

After securing the devices 10 to the carrier 32, FIG. 4(C) shows the film 22 being formed over the passive sides of the devices 10. In one embodiment, the film 22 is attached to a carrier 34 and then placed over the devices 10. The film 22 may comprise a dry film photo resistance, a grinding tape, or a sawing tape. The film 22 is sized to cover the devices 10, in the manner supplied. That is, if the devices 10 are formed while still part of a wafer, such as a 12" wafer, then the film 22 is sized to cover one side of the wafer. The shape of the film 22 also depends on how the devices 10 are provided. If the devices 10 are provided on a reel, as shown in FIG. 4(A), then the film 22 is rectangular, but if the devices 10 are provided as part of a wafer, then the film 22 would be circular. The film 22 may have a thickness from tens to hundreds of micrometres for die coverage. The film 22 may have a composition including a binder, metal/rubber fillers, resin, polymer, macro-molecular compounds, and so on, as per the application.

In one embodiment, the carrier 34 comprises a thermally conductive material, such as a metal or metal alloy, and functions as a heat sink.

FIG. 4(D) shows the film 22 on the carrier 34 being pressed onto the devices 10 so that the film 22 covers the passive major surface and the lateral side surfaces of the devices 10. The film 22 may be fit over the top and side surfaces of the devices 10 using compression and/or heat, and adhered to the top and side surfaces with an adhesion promoter. At this stage, either the film 22 or the carrier 34 may be marked with information to identify the devices, device lots, manufacturing date, etc. using a laser marking machine 36. Additionally, if necessary, a curing step may be performed after forming the film 22 over the top and side surfaces of the devices 10. An example curing process comprises baking the assembly in a curing oven for about 90 minutes at 145° C. to about 200° C. Although not shown, the carrier 34 may be thinned by removing a portion of an exposed surface of the carrier 34, such as by grinding or cutting, as desired.

After forming the film 22 over the top and side surfaces of the devices 10, the devices are separated by cutting the film 22 and carrier 34 at locations between the devices 10, as shown in FIG. 4(F). The singulation may be performed using a saw 38 as is known in the art, to form a plurality of packaged semiconductor devices 20. Other singulation methods also may be used though, such a laser singulation. It also will be understood by those of skill in the art that the conductive balls 16 may be attached to the exposed metal ends of the RDL 14 after the singulation step. That is, the initially supplied devices 10 may be provided without already having the conductive balls 16 attached, which in some instances may facilitate attaching the devices to the carrier 32, and attaching the film 22 to the devices. However, if a heat sink is not desirable, then the carrier 34 may be removed prior to singulation, and in such case, singulation may be performed with a laser, since only the film 22 would need to be cut to separate adjacent devices.

Finally, FIG. 4(F) shows the devices 20 being picked up and removed from the carrier 32 by a device 40. The first carrier 32 is just a temporary carrier and is not part of the final package 20. The device 40 may be a commercially available pick-up device that uses suction to pick-up devices.

Referring again to FIGS. 2 and 3, it can be seen that the present invention provides packaged semiconductor devices with 5-sided protection, where the protection may comprise protection from banging, jarring or vibration, or radiation shielding. The conductive film 22 may be attached to a carrier that later remains a part of the final package and functions as a heat sink.

As is evident from the foregoing discussion, the present invention provides a semiconductor device and a method of assembling the semiconductor device. The invention has the following benefits, small and thin wafer level package that provides EMI shielding and heat dissipation.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined the appended claims.

The invention claimed is:

1. A method of assembling a plurality of semiconductor devices, comprising:
    attaching a plurality of wafer level semiconductor devices to a carrier, wherein each wafer level semiconductor device includes
        a semiconductor integrated circuit die with a die active surface, bonding pads on the die active surface, a die passive surface, and four die lateral side surfaces, and
        a redistribution layer (RDL) formed over the die active surface, wherein the RDL has four RDL lateral side surfaces that are coplanar with the four die lateral side surfaces, an exposed RDL surface, and solder bump bond pads at the exposed RDL surface that are electrically connected through the RDL to the bonding pads of the die, and wherein the exposed RDL surface corresponds to an active side of the device, and the die passive surface corresponds to a passive side of the device, and
    wherein active sides of the devices are attached to the carrier, and passive sides of the devices are face-up;
    covering the passive sides of the devices with a conductive film to provide a plurality of film-covered devices, wherein the conductive film also covers the four die lateral side surfaces and the four RDL lateral side surfaces;
    attaching a thermally conductive material to a top, exposed surface of the conductive film; and
    after attaching the thermally conductive material, separating adjacent ones of the film-covered devices from each other to provide individual shielded devices, wherein after separation, a perimeter of the thermally conductive material and lateral sides of the conductive film are coplanar for each of the individual shielded devices.

2. The method of claim 1, wherein the conductive film is laminated to the passive and lateral sides of the devices.

3. The method of claim 1, wherein the semiconductor devices comprise wafer-level chip scale packages (WLCSP) that include conductive balls coupled to the solder bump bond pads of the RDL.

4. The method of claim 3, wherein the RDL is formed between semiconductor dies thereof and the conductive balls.

5. The method of claim 1, wherein the conductive film comprises a die attach film with an inner metal filler.

6. The method of claim 1, wherein the conductive film is electrically connected to the RDL.

7. The method of claim 1, wherein the thermally conductive material comprises a metal carrier.

8. The method of claim 7, wherein the metal carrier is attached to the conductive film with an adhesive.

9. A packaged semiconductor device assembled according to the method of claim 1.

10. The method of claim 1, wherein the conductive film does not cover the exposed RDL surface.

11. A packaged semiconductor device, comprising:
    a semiconductor integrated circuit die having an active surface, bonding pads on the active surface, a passive surface, and four lateral side surfaces extending between the active and passive surfaces;
    a redistribution layer (RDL) formed over the active surface of the integrated circuit die, wherein the RDL has four lateral side surfaces that are coplanar with the four lateral side surfaces of the die, an exposed RDL surface, and solder bump bond pads at the exposed RDL surface that are electrically connected through the RDL to the bonding pads of the die;
    a conductive film formed over the passive surface, the four lateral side surfaces of the die, and the four lateral side surfaces of the RDL, wherein the conductive film provides shielding of the integrated circuit die; and
    a thermally conductive material attached to a top, exposed surface of the conductive film, wherein a perimeter of the thermally conductive material is coplanar with lateral side surfaces of the conductive film that overly the four lateral side surfaces of the die.

12. The packaged semiconductor device of claim 11, wherein the conductive film is laminated to the passive surface and four lateral side surfaces of the die.

13. The packaged semiconductor device of claim 11, wherein the conductive film comprises a die attach film with an inner metal filler.

14. The packaged semiconductor device of claim 11, wherein the conductive film comprises a die attach film with an inner metal filler, and the conductive film is electrically connected to the RDL.

15. The packaged semiconductor device of claim 11, further comprising a plurality of conductive balls attached to the solder bump bond pads of the RDL, wherein the conductive balls are electrically connected to respective ones of the bonding pads on the active surface of the integrated circuit die by way of the RDL.

16. The packaged semiconductor device of claim 11, wherein the conductive film is electrically connected to an exposed terminal of the RDL.

17. The method of claim 11, wherein the conductive film does not cover the exposed RDL surface.

* * * * *